(12) United States Patent
Baek et al.

(10) Patent No.: US 10,490,514 B2
(45) Date of Patent: Nov. 26, 2019

(54) SEMICONDUCTOR DEVICES

(71) Applicant: Samsung Electronics Co., Ltd., Suwon-si, Gyeonggi-do (KR)

(72) Inventors: Nam-Gyu Baek, Suwon-si (KR); Yun-Rae Cho, Suwon-si (KR); Hyung-Gil Baek, Suwon-si (KR); Sun-Dae Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/382,283

(22) Filed: Apr. 12, 2019

(65) Prior Publication Data

US 2019/0237414 A1 Aug. 1, 2019

Related U.S. Application Data

(63) Continuation of application No. 15/459,917, filed on Mar. 15, 2017, now Pat. No. 10,304,781.

(30) Foreign Application Priority Data

May 25, 2016 (KR) ......................... 10-2016-0064223

(51) Int. Cl.
*H01L 23/00* (2006.01)
*H01L 21/66* (2006.01)
*H01L 23/58* (2006.01)

(52) U.S. Cl.
CPC ............ *H01L 23/562* (2013.01); *H01L 22/34* (2013.01); *H01L 23/585* (2013.01)

(58) Field of Classification Search
CPC ...... H01L 23/562; H01L 22/34; H01L 23/585

USPC ............................ 257/48; 438/11, 14, 15, 18
See application file for complete search history.

(56) References Cited

U.S. PATENT DOCUMENTS

| 4,928,162 | A | 5/1990 | Lesk et al. |
| 5,814,887 | A | 9/1998 | Tani |
| 7,314,811 | B2 | 1/2008 | Tan et al. |
| 7,339,256 | B2 | 3/2008 | Nakamura et al. |
| 7,378,720 | B2 | 5/2008 | Fu et al. |
| 7,586,175 | B2 | 9/2009 | Lee et al. |
| 7,875,502 | B2 | 1/2011 | Brofman et al. |
| 7,960,814 | B2 | 6/2011 | Vo |

(Continued)

FOREIGN PATENT DOCUMENTS

| JP | 2005-229086 A | 8/2005 |
| JP | 2006-332344 A | 12/2006 |
| JP | 2015-128178 A | 7/2015 |

*Primary Examiner* — Didarul A Mazumder
(74) *Attorney, Agent, or Firm* — Myers Bigel, P.A.

(57) ABSTRACT

The semiconductor devices may include a semiconductor substrate, and a guard ring and a crack sensing circuit on the semiconductor substrate. The semiconductor substrate may include a main chip region that is defined by the guard ring and includes the crack sensing circuit, a central portion of the main chip region surrounded by the crack sensing circuit, and a chamfer region that is in a corner portion of the main chip region and is defined by the guard ring and the crack sensing circuit. The semiconductor devices may also include at least one gate structure on the semiconductor substrate in the main chip region, a plurality of metal pattern structures on the at least one gate structure in the chamfer region, and an insulating layer on the plurality of metal pattern structures. The plurality of metal pattern structures may extend in parallel to one another and may have different lengths.

15 Claims, 14 Drawing Sheets

(56) References Cited

U.S. PATENT DOCUMENTS

| | | |
|---|---|---|
| 8,014,154 B2 | 9/2011 | Lee |
| 8,063,468 B2 | 11/2011 | Fujita et al. |
| 8,125,054 B2 | 2/2012 | West et al. |
| 8,237,281 B2 | 8/2012 | Takemura et al. |
| 8,692,357 B2 | 4/2014 | Ning |
| 8,710,630 B2 | 4/2014 | Chen |
| 8,963,291 B2 | 2/2015 | Furusawa et al. |
| 9,059,167 B2 | 6/2015 | Farooq et al. |
| 2003/0218254 A1* | 11/2003 | Kurimoto ......... H01L 21/76807 257/758 |
| 2004/0150073 A1 | 8/2004 | Matumoto et al. |
| 2006/0055005 A1* | 3/2006 | Furusawa ............. H01L 23/564 257/635 |
| 2007/0096092 A1 | 5/2007 | Huang et al. |
| 2007/0102791 A1 | 5/2007 | Wu |
| 2009/0039470 A1 | 2/2009 | Vo |
| 2009/0121313 A1 | 5/2009 | Hashimoto |
| 2010/0078769 A1 | 4/2010 | West et al. |
| 2011/0215447 A1 | 9/2011 | Furusawa et al. |
| 2013/0099391 A1* | 4/2013 | Lamorey ............... H01L 23/585 257/777 |
| 2014/0239455 A1* | 8/2014 | Ishii ..................... H01L 23/564 257/620 |
| 2014/0319522 A1 | 10/2014 | Daubenspeck et al. |
| 2015/0048522 A1 | 2/2015 | Park et al. |
| 2015/0108613 A1* | 4/2015 | Furusawa ............. H01L 23/564 257/620 |
| 2016/0172359 A1* | 6/2016 | Yoon .................. H01L 27/0886 257/401 |

* cited by examiner

SEMICONDUCTOR DEVICES

CROSS-REFERENCE TO RELATED APPLICATIONS

This U.S. non-provisional patent application is a continuation of and claims priority to U.S. patent application Ser. No. 15/459,917, filed Mar. 15, 2017 in the United States Patent and Trademark Office, which in turn claims priority under 35 U.S.C. § 119 to Korean Patent Application No. 10-2016-0064223, filed on May 25, 2016, in the Korean Intellectual Property Office, the disclosures of which are hereby incorporated by reference herein in their entireties.

BACKGROUND

The present disclosure generally relates to semiconductor devices, and more particularly, to semiconductor devices including a metal pattern structure reducing dispersion of cracks generated during a die sawing process.

Processes of forming integrated circuit devices (e.g., semiconductor devices) may include a die sawing process for cutting a substrate (e.g., semiconductor substrate) on which the integrated circuit devices are formed. During a die sawing process, a sawing blade may cut a substrate along a scribe lane region to physically separate integrated circuit devices. For high capacity and high integration of integrated circuit devices, an area of the substrate occupied by a scribe lane region has been decreased. Accordingly, a risk of damage to the integrated circuit devices associated with stress applied to the integrated circuit devices during a die sawing process has increased.

SUMMARY

According to some embodiments of the inventive concepts, a semiconductor device may include a metal pattern structure for reducing or possibly preventing dispersion of cracks which may be generated during a die sawing process for cutting a semiconductor substrate.

According to some embodiments of the inventive concepts, a method of manufacturing a semiconductor device including a metal pattern structure for reducing or possibly preventing dispersion of cracks which may be generated during a die sawing process for cutting a semiconductor substrate is provided.

According to some embodiments of the inventive concepts, there is provided a semiconductor device that may include a semiconductor substrate, and a guard ring and a crack sensing circuit on the semiconductor substrate. The semiconductor substrate may include a main chip region that is defined by the guard ring and the crack sensing circuit, a central portion of the main chip region surrounded by the crack sensing circuit, and a chamfer region that is in a corner portion of the main chip region and is defined by the guard ring and the crack sensing circuit. The semiconductor device may also include at least one gate structure on the semiconductor substrate in the main chip region, a plurality of metal pattern structures on the at least one gate structure in the chamfer region, and an insulating layer on the plurality of metal pattern structures. The plurality of metal pattern structures may extend in parallel to one another and may have different lengths.

According to some embodiments of the inventive concepts, there is provided a semiconductor device that may include a semiconductor substrate including a square-shaped main chip region defined by a first edge portion in a first direction and a second edge portion in a second direction that is perpendicular to the first direction, and a triangle-shaped chamfer region in a corner portion of the main chip region. The semiconductor device may also include a plurality of metal pattern structures on the semiconductor substrate in the chamfer region. Each of the plurality of metal pattern structures may have a bar shape, and the plurality of metal pattern structures may have different lengths. The plurality of metal pattern structures may extend in the first direction, may extend in a direction having an angle relative to the first direction, may extend in a direction parallel to a hypotenuse of the chamfer region or may extend in a direction having an angle relative to the hypotenuse of the chamfer region. The plurality of metal pattern structures may have an equal height in a third direction that is perpendicular to the first direction and the second direction. The semiconductor device may further include an insulating layer on the plurality of metal pattern structures.

According to some embodiments of the present inventive concepts, a semiconductor device may include an insulating layer on a substrate. The insulating layer may contact the substrate. The semiconductor device may also include a guard ring on the substrate. The guard ring may extend along an edge of the substrate and may extend through the insulating layer. The semiconductor device may further include a plurality of metal pattern structures in a corner portion of the substrate that is adjacent to the guard ring. The plurality of metal pattern structures may be in the insulating layer and may have uppermost surfaces that are coplanar with an upper surface of the insulating layer. The plurality of metal pattern structures may have lengths that are different from one another and decrease along a direction.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Hereinafter, example embodiments of the present inventive concepts will be described in detail by referring to the accompanying drawings.

Figure 1:
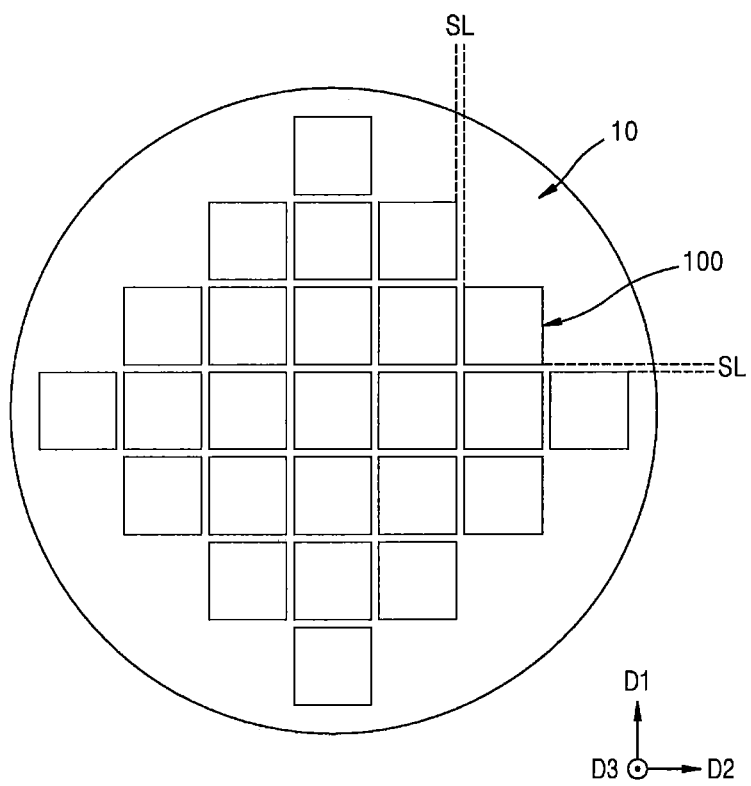
FIG. 1 is a plan view of a semiconductor substrate including a semiconductor device according to some embodiments of the present inventive concepts.

FIG. 1 is a plan view of a semiconductor substrate 10 including a plurality of semiconductor devices 100 according to some embodiments of the present inventive concepts.

Referring to FIG. 1, the semiconductor substrate 10 including the plurality of semiconductor devices 100 and a scribe lane region SL defined between the plurality of semiconductor devices 100 is provided.

The semiconductor substrate 10 may refer to a wafer. The semiconductor substrate 10 may include a semiconductor material, for example, silicon (Si). In some embodiments, the semiconductor substrate 10 may include a semiconductor material, such as germanium (Ge), or a compound semiconductor material, such as silicon carbide (SiC), gallium arsenide (GaAs), indium arsenide (InAs), and indium phosphide (InP). In some embodiments, the semiconductor substrate 10 may have a silicon on insulator (SOI) structure. The semiconductor substrate 10 may include a conductive region, for example, a well doped with impurities or a structure doped with impurities. The semiconductor substrate 10 has an upper surface on which the plurality of semiconductor devices 100 are formed, and a lower surface opposite the upper surface. The lower surface may be a polished surface on which a polishing process is performed to make the semiconductor substrate 10 thinner. The polishing process may include grinding.

The plurality of semiconductor devices 100 may be two-dimensionally arranged on the upper surface of the semiconductor substrate 10. The semiconductor device 100 may include, for example, a memory element, a logic element, etc. It will be understood that the semiconductor device 100 may refer to a semiconductor chip.

The scribe lane region SL may extend in a first direction D1 and a second direction D2 perpendicular to the first direction D1. The scribe lane region SL may have a shape of a straight lane having a certain width. That is, the plurality of semiconductor devices 100 may be arranged apart from each other by being surrounded by the scribe lane region SL. In general, the plurality of semiconductor devices 100 may be separated into individual semiconductor chips by, for example, a die sawing process along the scribe lane region SL.

The scribe lane region SL may be divided into a first region surrounding an edge portion of the semiconductor device 100 that is adjacent to the semiconductor device 100, and a second region surrounding the first region. That is, the second region may be spaced apart from the semiconductor device 100 with the first region interposed between the second region and the semiconductor device 100. A sawing blade may not reach the first region during the die sawing process and the first region may provide a margin of the die sawing process. The sawing blade may cut the second region during the die sawing process. That is, the sawing blade may separate the semiconductor devices 100 along the second region.

As the semiconductor substrate 10 and various types of material layers on the semiconductor substrate 10 are cut by the die sawing process, the semiconductor substrate 10 may be physically divided into the plurality of semiconductor devices 100.

Recently, as high capacity and high integration of an integrated circuit device have been desired, an area of the semiconductor substrate, which is occupied by the scribe lane region, has been decreased, and due to stress applied to the semiconductor device during the die sawing process, a risk of damage to the integrated circuit device has increased.

Accordingly, according to the present inventive concepts, there is provided the semiconductor device 100 capable of reducing or possibly preventing defects of the integrated circuit device caused by dispersion of cracks generated in the scribe lane region SL during a die sawing process for cutting the semiconductor substrate 10, by including, without an additional forming process, a plurality of metal pattern structures (e.g., 210 in FIG. 2) for preventing the dispersion of the cracks.

Figure 2:
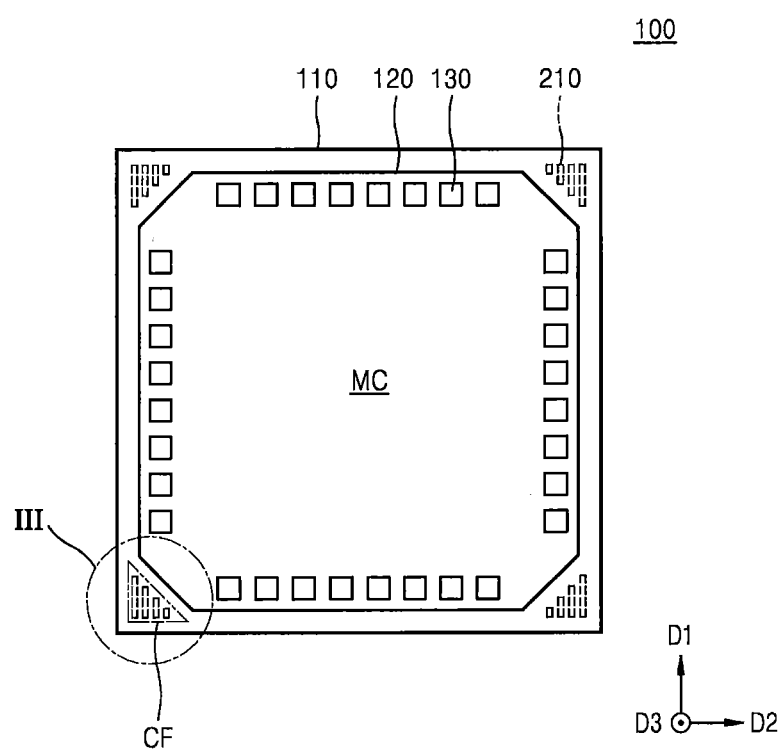
FIG. 2 is a plan view of a semiconductor device according to some embodiments of the present inventive concepts.

FIG. 2 is a plan view of a semiconductor device 100 according to some embodiments of the present inventive concepts.

Referring to FIG. 2, one semiconductor device 100 may be separated by the scribe lane region SL (refer to FIG. 1). A square-shaped guard ring 110 surrounding a main chip region MC may be formed at an outermost portion of the semiconductor device 100. The main chip region MC is a square-shaped region defined by an edge portion in a first direction D1 and an edge portion in a second direction D2. The main chip region MC may include a memory element, a logic element, etc.

A crack sensing circuit 120 surrounding a central portion of the main chip region MC and a chamfer region CF in a corner portion of the main chip region MC defined by the guard ring 110 may be formed. The crack sensing circuit 120 may be formed in the main chip region MC. Also, a plurality of connection pads 130 for electrical connection between the semiconductor device 100 and external circuits may be formed around each of sides of the crack sensing circuit 120.

In some embodiments, the chamfer region CF may be formed at every corner of the main chip region MC as illustrated in FIG. 2. The chamfer region CF may include a plurality of metal pattern structures 210. The plurality of metal pattern structures 210 may extend in parallel to each other and may have different lengths. In some embodiments, the plurality of metal pattern structures 210 may extend in the first direction D1 and a length of each of the plurality of metal pattern structures 210 may monotonically decrease along the second direction D2, as illustrated in FIG. 2. An insulating layer covering the plurality of metal pattern structures 210 may be located in the chamfer region CF. That is, upper surfaces of the plurality of metal pattern structures 210 may be covered by the insulating layer and may not be exposed.

The semiconductor device 100 according to some embodiments may include, without an additional forming process, the plurality of metal pattern structures 210 for reducing and possibly preventing dispersion of cracks generated during a die sawing process for cutting the semiconductor substrate 10 (refer to FIG. 1), and thus, may reduce or possibly prevent defects of an integrated circuit device caused by the dispersion of the cracks generated in the scribe lane region SL into the main chip region MC. Accordingly, the reliability and the productivity of the semiconductor device 100 may be improved. Hereinafter, aspects with respect to the plurality of metal pattern structures 210 will be described in detail.

Figure 3:
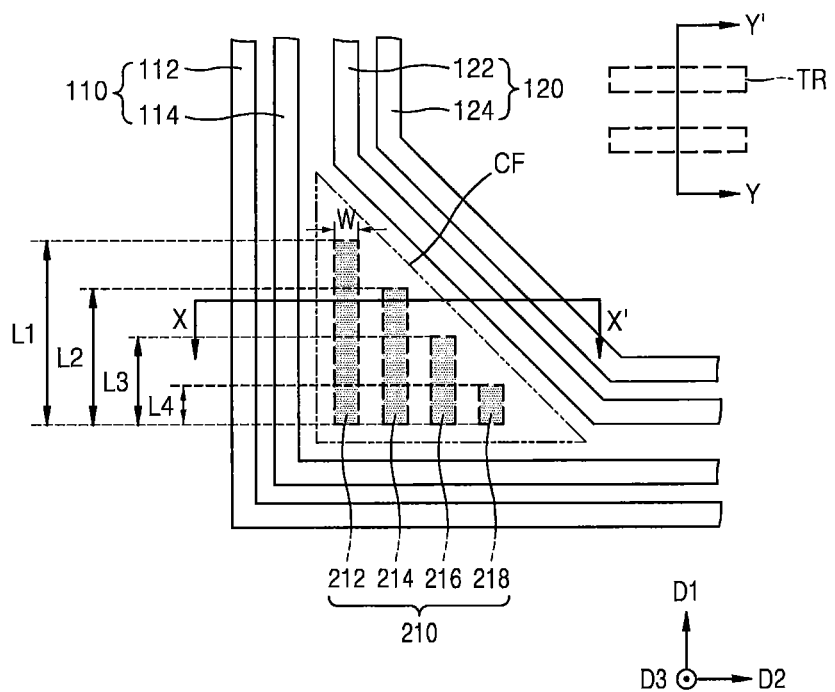
FIG. 3 is a plan view of a chamfer region and a peripheral region of a semiconductor device according to some embodiments of the present inventive concepts.

FIG. 3 is a plan view of the chamfer region CF and a peripheral region of the semiconductor device 100 according to some embodiments of the present inventive concepts.

FIG. 3 is the enlarged plan view of the chamfer region CF of the semiconductor device 100 of FIG. 2 and the peripheral portion III of the semiconductor device 100 of FIG. 2. The triangle-shaped chamfer region CF may be at a lower left corner of the main chip region MC (refer to FIG. 2) and may be defined (e.g., bounded) by the guard ring 110 and the crack sensing circuit 120. FIG. 3 illustrates that the chamfer region CF has a shape of a right triangle having the same length in the first direction D1 and the second direction D2 as an example. However, the chamfer region CF is not limited thereto and may have a triangular shape having different lengths in the first direction D1 and the second direction D2.

The guard ring 110 may be formed as a square shape defining the edge portion in the first direction D1 and the edge portion in the second direction D2 of the main chip region MC.

The guard ring 110 may be formed in plural guard rings. In some embodiments, two guard rings 110 may surround the edge portions of the main chip region MC as illustrated in FIG. 3. However, the number of guard rings 110 is not limited thereto. For example, a first guard ring 112 which is far from the central portion of the main chip region MC and a second guard ring 114 which is close to the central portion of the main chip region MC may be provided. The first guard ring 112 and the second guard ring 114 may have the same width in a plan view.

The crack sensing circuit 120 is a circuit for measuring a resistance value in a certain contact region, analyzing a pattern of the measured resistance value, and determining whether cracks occur in the semiconductor device 100.

In some embodiments, the crack sensing circuit 120 may be formed to surround the central portion of the main chip region MC. Each of corner portions of the crack sensing circuit 120 may be formed as a chamfering shape as illustrated in FIG. 2. That is, the crack sensing circuit 120 may be formed to have a shape of an octagon.

The crack sensing circuit 120 may be formed in plural circuits. In some embodiments, two crack sensing circuit 120 may surround the central portion of the main chip region MC as illustrated in FIG. 3. However, the number of crack sensing circuits 120 is not limited thereto. A first crack sensing circuit 122 which is far from the central portion of the main chip region MC and a second crack sensing circuit 124 which is close to the central portion of the main chip region MC may be provided. The first crack sensing circuit 122 and the second crack sensing circuit 124 may have the same width in a plan view.

The chamfer region CF may be formed in the corner portion of the main chip region MC as a region defined by the guard ring 110 and the crack sensing circuit 120. The chamfer region CF may have different sizes and/or different shapes depending on semiconductor devices.

The plurality of metal pattern structures 210 may include metal pattern structures 212, 214, 216, and 218 that have different lengths and extend in parallel to one another. Lengths of the metal pattern structures 212, 214, 216, and 218 may monotonically decrease along the second direction D2 as illustrated in FIG. 3. FIG. 3 illustrates that the metal pattern structures 210 include the four metal pattern structures 212, 214, 216, and 218 as an example. However, the number of metal pattern structures 210 is not limited thereto.

The plurality of metal pattern structures 210 may be formed on the semiconductor substrate 10 (refer to FIG. 1) in the chamfer region CF. Each of the plurality of metal pattern structures 210 may have a bar shape. The plurality of metal pattern structures 210 may have different lengths L1, L2, L3, and L4 in the first direction D1 and may have the same height H (refer to FIG. 13) in a third direction D3 that is perpendicular to the first direction D1 and the second direction D2. In some embodiments, the plurality of metal pattern structures 210 may extend in a direction forming a certain angle relative to the first direction D1.

The metal pattern structures 212, 214, 216, and 218 included in the plurality of metal pattern structures 210 may extend in parallel to the edge portion in the first direction D1, may extend in the first direction D1, and may have lengths L1, L2, L3, and L4, respectively, that sequentially decrease as a distance between the metal pattern structures 212, 214, 216, and 218 and the edge portion in the first direction D1 increases.

The metal pattern structures 212, 214, 216, and 218 included in the plurality of metal pattern structures 210 may have the same width W in a plan view. However, it is not limited thereto, and the metal pattern structures 212, 214, 216, and 218 may have different widths. Also, the metal pattern structures 212, 214, 216, and 218 included in the plurality of metal pattern structures 210 may be spaced apart from each other by the same distance. However, it is not limited thereto, and the metal pattern structures 212, 214, 216, and 218 may be spaced apart from each other by different distances. Also, the plurality of metal pattern structures 210 may be spaced apart from the edge portion in the first direction D1 and the edge portion in the second direction D2 by a certain distance. That is, the plurality of metal pattern structures 210 may be spaced apart from the guard ring 110.

An insulating layer may be formed to cover the plurality of metal pattern structures 210. That is, upper surfaces of the plurality of metal pattern structures 210 may not be exposed.

Due to stress applied to the semiconductor device 100 (refer to FIG. 2) during a die sawing process, a risk of damage to an integrated circuit device has increased. In particular, stress due to the die sawing process in the first direction D1 and stress due to the die sawing process in the second direction D2 are accumulated in corner portions of the semiconductor device 100. Thus, cracks may occur in the corner portions of the semiconductor device 100 more frequently than in side portions of the semiconductor device 100, and the corner portions of the semiconductor device 100 may be affected by a higher intensity of stress than side portions of the semiconductor device 100. Thus, defects in the integrated circuit device may be caused particularly by the cracks in the corner portions of the semiconductor device 10.

Thus, the plurality of metal pattern structures 210 may be formed at each corner of the semiconductor device 100 to reduce or possibly prevent dispersion of cracks. By doing so, defects of the semiconductor device 100 may decrease, and further, the reliability and the productivity of the semiconductor device 100 may be improved.

Figure 4:
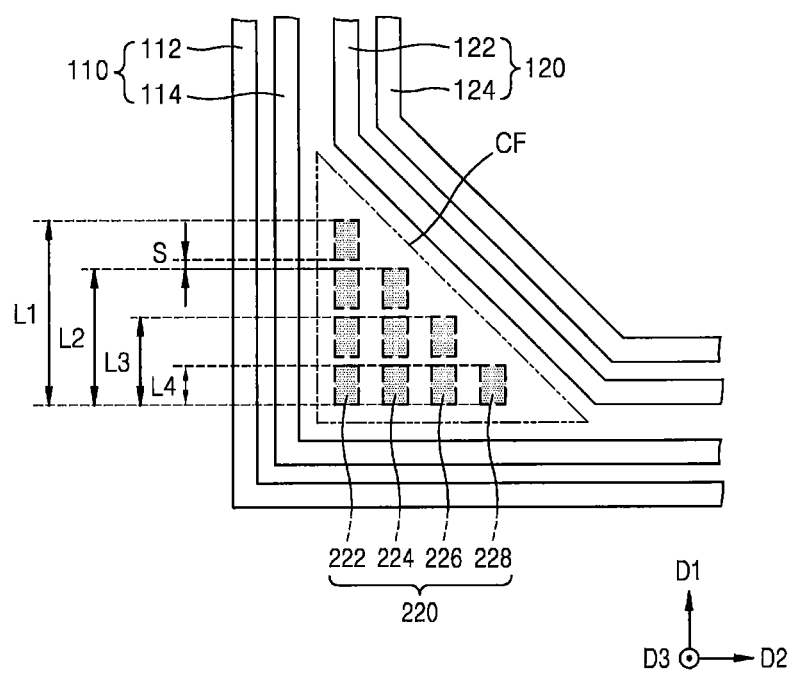
FIG. 4 is a plan view of a chamfer region and a peripheral region of a semiconductor device according to some embodiments of the present inventive concepts.

FIG. 4 is a plan view of the chamfer region CF and a peripheral region of the semiconductor device 100 according to some embodiments of the present inventive concepts. Repeated aspects will not be described in detail.

FIG. 4 illustrates the triangle-shaped chamfer region CF defined by the guard ring 110 and the crack sensing circuit 120 and a plurality of metal pattern structures 220 in the chamfer region CF.

The plurality of metal pattern structures 220 may be formed on the semiconductor substrate 10 (refer to FIG. 1) in the chamfer region CF. Each of the plurality of metal pattern structures 220 may have a bar shape. The plurality of metal pattern structures 220 may extend in parallel to each other, may have different lengths L1, L2, L3, and L4 in the first direction D1, and may have the same height H (refer to FIG. 13) in the third direction D3. In some embodiments, the plurality of metal pattern structures 220 may extend in a direction forming a certain angle relative to the first direction D1.

Metal pattern structures 222, 224, 226, and 228 included in the plurality of metal pattern structures 220 may extend in parallel to the edge portion in the first direction D1, may have lengths L1, L2, L3, and L4 in the first direction D1. Lengths of the metal pattern structures 222, 224, 226, and 228 may sequentially decrease as distances between the metal pattern structures 222, 224, 226, and 228 and the edge portion in the first direction D1 increase as illustrated in FIG. 4.

In some embodiments, as illustrated in FIG. 4., the metal pattern structures 222, 224, 226, and 228 included in the plurality of metal pattern structures 220 may have a shape of a discontinuous bar having slits S. Distances between the slits S may be the same. However, it is not limited thereto, and the distances between the slits S may be different. The slits S may be formed parallel to the second direction D2. However, it is not limited thereto, and the slits S may be formed to have a certain angle relative to the second direction D2.

Also, the metal pattern structures 222, 224, 226, and 228 included in the plurality of metal pattern structures 220 may have the same width in a plan view and may be spaced apart from each other by the same distance. However, it is not limited thereto. The plurality of metal pattern structures 220 may be spaced apart from the edge portion in the first direction D1 and the edge portion in the second direction D2 by a certain distance.

Figure 5:
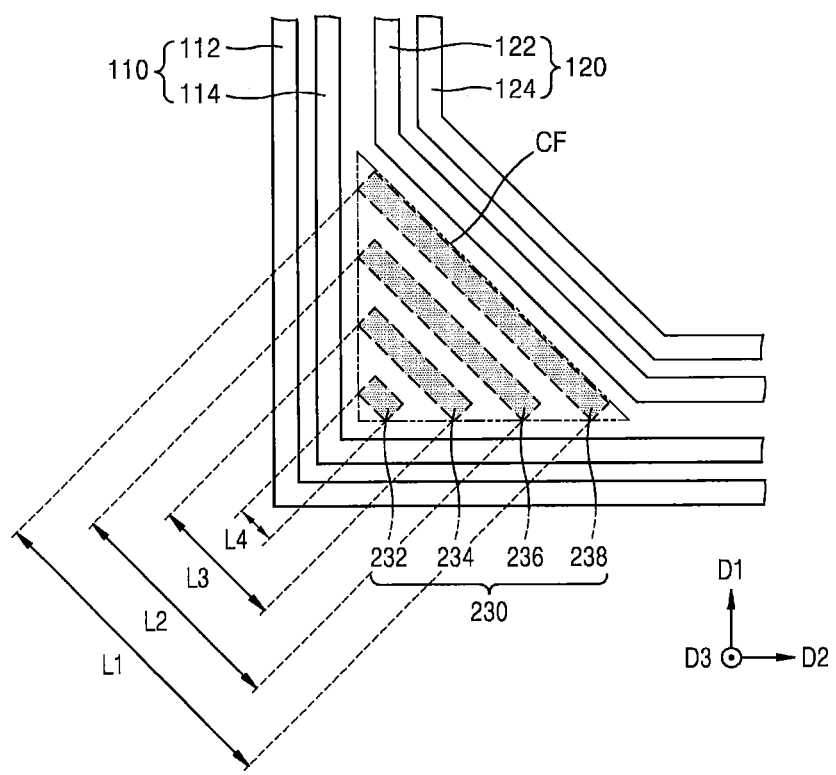
FIG. 5 is a plan view of a chamfer region and a peripheral region of a semiconductor device according to some embodiments of the present inventive concepts.

FIG. 5 is a plan view of the chamfer region CF and a peripheral region of the semiconductor device 100 according to some embodiments of the present inventive concepts. Repeated aspects will not be described in detail.

FIG. 5 illustrates the triangle-shaped chamfer region CF defined by the guard ring 110 and the crack sensing circuit 120 and a plurality of metal pattern structures 230 in the chamfer region CF.

The plurality of metal pattern structures 230 may be arranged on the semiconductor substrate 10 (refer to FIG. 1) in the chamfer area CF, may extend in parallel to a hypotenuse of the chamfer region CF, and may have sequentially decreasing lengths L1, L2, L3, and L4 as the plurality of metal pattern structures 230 are far from the hypotenuse of the chamfer region CF, as illustrated in FIG. 3. That is, the plurality of metal pattern structures 230 may be formed to have a shape of a continuous bar having different lengths L1, L2, L3, and L4 in a direction having a certain angle, for example, 45°, relative to the first direction D1 and having the same height H (refer to FIG. 13) in the third direction D3. In some embodiments, the plurality of metal pattern structures 230 may extend in a direction forming a certain angle relative to the hypotenuse of the chamfer region CF.

Although it is not illustrated, metal pattern structures 232, 234, 236, and 238 included in the plurality of metal pattern structures 230 may have a shape of a discontinuous bar having slits. Distances between the slits may be the same. However, it is not limited thereto, and the distances may be different.

Also, the metal pattern structures 232, 234, 236, and 238 included in the plurality of metal pattern structures 230 may have the same width in a plan view and may be spaced apart from each other by the same distance. However, it is not limited thereto. The plurality of metal pattern structures 230 may be spaced apart from the edge portion in the first direction D1 and the edge portion in the second direction D2 by a certain distance.

Figure 6:
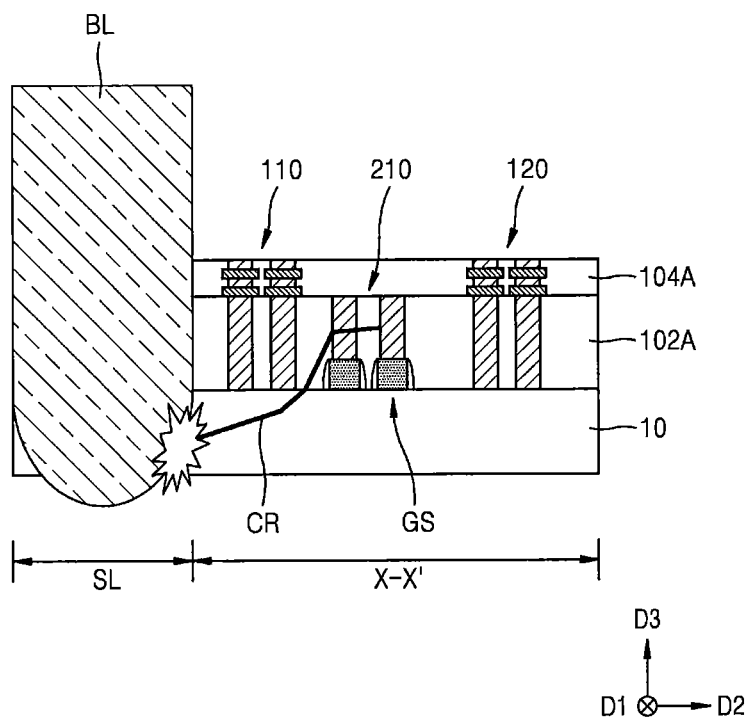
FIG. 6 is a cross-sectional views illustrating that cracks generated in a scribe lane region during a die sawing process are dispersed to a semiconductor device.

FIG. 6 is a cross-sectional views illustrating that cracks generated in the scribe lane region SL during a die sawing process are dispersed to the semiconductor device 100.

FIG. 6 illustrates a sectional view, taken along the line X-X' of FIG. 3, of a portion of the semiconductor device 100, which includes the guard ring 110, the plurality of metal pattern structures 210, and the crack sensing circuit 120.

The sawing blade BL cuts an upper insulating layer 104A, a lower insulating layer 102A, and the semiconductor substrate 10 in a direction from an upper surface of the upper insulating layer 104A toward a lower surface of the semiconductor substrate 10. While the sawing blade BL cuts the semiconductor device 100 (refer to FIG. 2) along the scribe lane region SL, stress is generated due to, for example, physical friction, etc. between the sawing blade BL and the upper and lower insulating layers 104A and 102A. Such stress may cause cracks CR advancing in the semiconductor device 100, and when the cracks CR advance to the main chip region MC (refer to FIG. 2), the reliability of an integrated circuit device may be deteriorated.

The cracks CR started in the scribe lane region SL may move along the semiconductor substrate 10 and the lower insulating layer 102A, and when the cracks CR reach the plurality of metal pattern structures 210, the stress may be distributed and the cracks CR may dissipate. In some embodiments, although it is not illustrated, the cracks CR started in an upper portion of the scribe lane region SL may move along the upper insulating layer 104A, and when the cracks CR advance in a height direction of the plurality of metal pattern structures 210, that is, the third direction D3, the cracks CR may not be dispersed to the main chip region MC and may proceed to a lower portion of the semiconductor substrate 10.

The cracks CR started in a portion in which the sawing blade BL contacts the upper and lower insulating layers 104A and 102A or the semiconductor substrate 10 and dispersed toward the main chip region MC may reach the plurality of metal pattern structures 201. Thus, the plurality of metal pattern structures 210 may block the dispersion of the cracks CR toward the main chip region MC.

The plurality of metal pattern structures 210 may extend from an upper surface of the gate structure GS to an upper surface of the lower insulating layer 102A. Both side walls of the plurality of metal pattern structures 210 may be covered by the lower insulating layer 102A, and upper surfaces of the plurality of metal pattern structures 210 may be covered by the upper insulating layer 104A. In some embodiments, the upper surfaces of the plurality of metal pattern structures 210 may be coplanar as illustrated in FIG. 6. Further, the upper surfaces of the plurality of metal pattern structures 210 may be coplanar with the upper surface of the lower insulating layer 102A.

Upper surfaces of the guard ring 110 and the crack sensing circuit 120 may be formed higher than the upper surfaces of the plurality of metal pattern structures 210 as illustrated in FIG. 6. That is, the guard ring 110 and the crack sensing circuit 120 may extend from an upper surface of the semiconductor substrate 10 to an upper surface of the upper insulating layer 104A.

Both side walls of each of the metal pattern structures included in the plurality of metal pattern structures 210 may be formed flat. That is, while the guard ring 110 and the crack sensing circuit 120 may have a protrusion portion at both side walls, the plurality of metal pattern structures 210 may include a single material, for example, a metal, such as tungsten, and may have a bar shape having flat side walls. Thus, since the plurality of metal pattern structures 210 do not have an adhesion interface of heterogeneous materials and a protrusion portion, the plurality of metal pattern structures 210 may effectively block the dispersion of the cracks CR in the second direction D2.

Figure 7A:
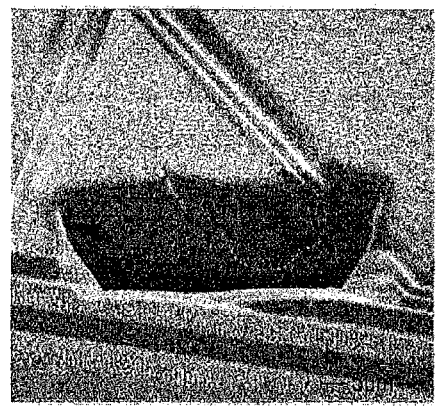
FIGS. 7A and 7B are scanning electron microscope (SEM) pictures showing crack dispersion in a semiconductor device according to a comparative example and a semiconductor device according to some embodiments of the present inventive concepts.
Figure 7B:

FIGS. 7A and 7B are scanning electron microscope (SEM) pictures showing crack dispersion in a semiconductor device according to a comparative example and a semiconductor device according to some embodiments of the present inventive concepts.

FIGS. 7A and 7B are SEM pictures showing how cracks are dispersed when stress is artificially applied to each of the semiconductor device according to the comparative example, in which the plurality of metal pattern structures are not formed, and the semiconductor device according to some embodiments of the inventive concepts.

FIG. 7A shows the crack dispersion in the semiconductor device according to the comparative example, in which the plurality of metal pattern structures are not formed. In FIG. 7A, the cracks are dispersed through an insulating layer to a crack sensing circuit.

FIG. 7B shows the crack dispersion in the semiconductor device according to some embodiments of the present inventive concepts. In FIG. 7B, the cracks are dissipated and are not dispersed to a cracking sensing circuit, when reach a plurality of metal pattern structures.

In the semiconductor device according to the comparative example, an average length of crack dispersion is about 7 µm, and in the semiconductor device according to some embodiments, an average length of crack dispersion is about 2 µm. Thus, the average length of crack dispersion is decreased by about 71% due to the plurality of metal pattern structures.

That is, due to the plurality of metal pattern structures, cracks may not be dispersed into a main chip region of the semiconductor device, and thus, defects of an integrated circuit device may be reduced or possibly prevented, and the reliability and the productivity of the semiconductor device may be improved.

Figure 8:
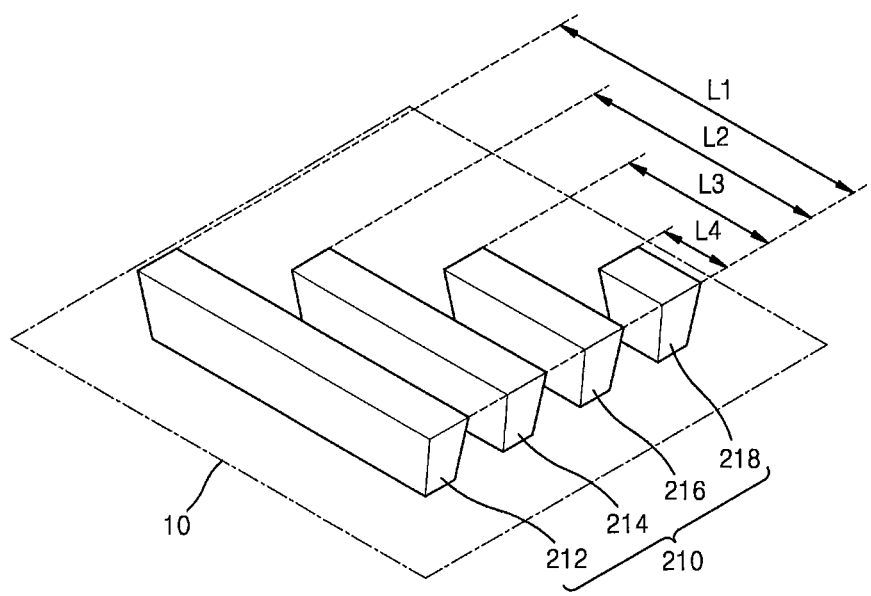
FIG. 8 is a perspective view of a metal pattern structure included in a semiconductor device according to some embodiments of the present inventive concepts.

FIG. 8 is a perspective view of the metal pattern structure 210 included in the semiconductor device 100 according to some embodiments of the present inventive concepts.

FIG. 8 is a schematic three-dimensional view of the plurality of metal pattern structures 210 formed on the semiconductor substrate 10.

Referring to FIGS. 8 and 3 together, the plurality of metal pattern structures 210 may be arranged on an upper surface of the semiconductor substrate 10, and may be formed to have the same height H (refer to FIG. 13), the same width W, and different lengths L1, L2, L3, and L4.

In some embodiments, the plurality of metal pattern structures 210 may have a line shape or a bar shape, as illustrated in FIG. 8. The plurality of metal pattern structures 210 may extend along an edge portion of the main chip region MC. Each of the plurality of metal pattern structures 210 may have an overturned ladder shape and widths of upper surfaces of the plurality of metal pattern structures 210 may be greater than widths of lower surfaces of the plurality of metal pattern structures 210. The overturned ladder shape may be formed based on a process of forming the plurality of metal pattern structures 210. The metal pattern structures 212, 214, 216, and 218 included in the plurality of metal pattern structures 210 may be formed as a single structure (e.g., unitary structure) including a single material. That is, the metal pattern structures 212, 214, 216, and 218 included in the plurality of metal pattern structures 210 may be formed as a structure without a joint so that cracks may be prevented from being dispersed through the joint. In some embodiments, each of the metal pattern structures 212, 214, 216, and 218 may have a unitary structure including a single material, and thus the metal pattern structures 212, 214, 216, and 218 may not include interfaces between different materials and/or structures.

FIGS. 9 through 13 are cross-sectional views, taken along the lines X-X' and Y-Y' in FIG. 3, illustrating a method of manufacturing a semiconductor device according to some embodiments of the present inventive concepts.

Figure 9:
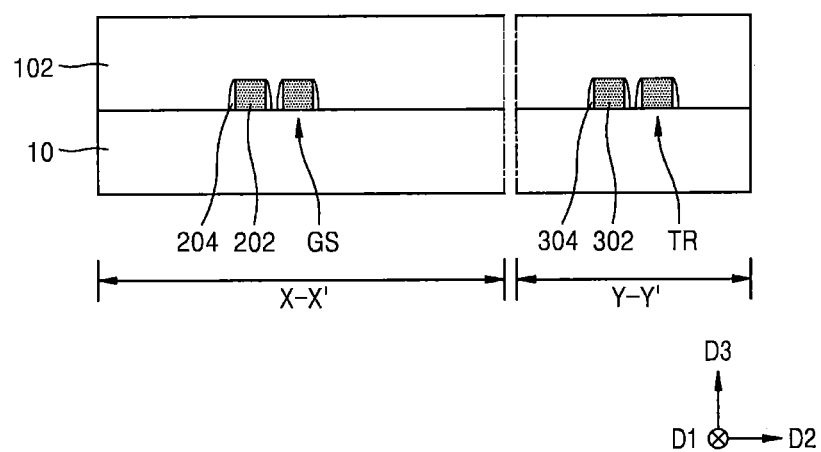
FIGS. 9 through 13 are cross-sectional views illustrating a method of manufacturing a semiconductor device according to some embodiments of the present inventive concepts.

Referring to FIG. 9, the semiconductor substrate 10 including a chamfer region and a cell region (and/or a peripheral circuit region, likewise hereinafter) in the main chip region MC (refer to FIG. 2) is provided. The cross-sectional view taken along the line X-X' in FIG. 3 shows the chamfer region CF, and the cross-sectional view taken along the line Y-Y' in FIG. 3 shows the cell region.

The gate structure GS may be formed on an upper surface of the semiconductor substrate 10 in the chamfer region CF, and a transistor TR may be formed on the upper surface of the semiconductor substrate 10 in the cell region. The gate structure GS and the transistor TR may be manufactured by the same process and may be formed to have the same shape. The gate structure GS and the transistor TR may have gate electrodes 202 and 302, respectively, and spacers 204 and 304 at both side walls of the gate electrodes 202 and 302, respectively.

The gate structure GS and the transistor TR may be manufactured by using the same process. Thus, here, only a method of forming the gate structure GS will be briefly described.

A gate forming layer (not shown) may be formed on the semiconductor substrate 10. A mask pattern (not shown) for forming a plurality of gate electrodes 202 may be formed on the gate forming layer. The mask pattern may be used as an etch mask to etch the gate forming layer in order to form the plurality of gate electrodes 202 on the semiconductor substrate 10. A spacer forming layer (not shown) covering the plurality of gate electrodes 202 may be formed. The spacer forming layer may be anisotropically etched to form a spacer 204 at both side walls of the plurality of gate electrodes 202.

A lower insulating layer forming layer 102 filling peripheral portions of the gate structure GS and the transistor TR may be formed on the semiconductor substrate 10. The lower insulating layer forming layer 102 may include, for example, an oxide, such as silicon oxide, a nitride, such as silicon nitride, or an oxynitride, such as silicon oxynitride.

Figure 10:
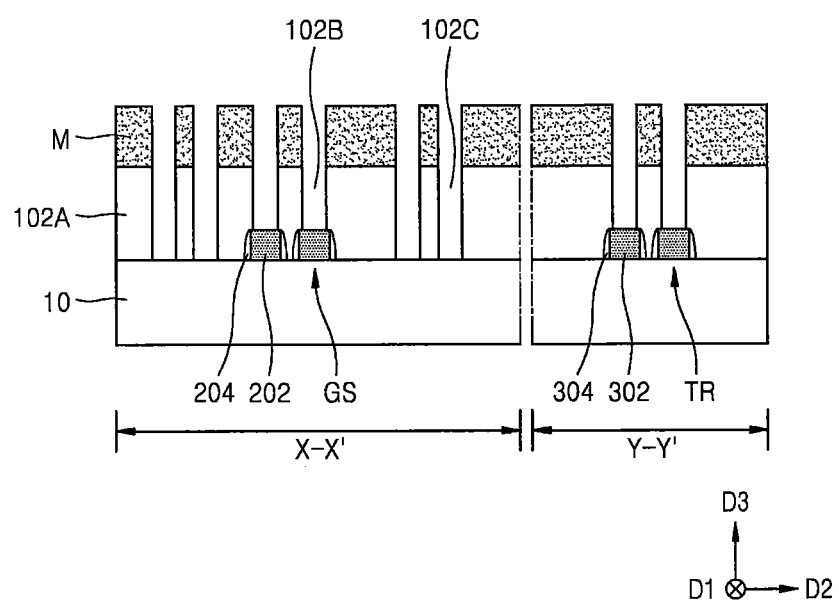

Referring to FIG. 10, a mask pattern M may be formed by using a photolithography process and an etching process. The mask pattern M may be formed by forming a photoresist layer on the lower insulating layer forming layer 102 (refer to FIG. 9) and performing a photolithography process and an etching process on the photoresist layer. This is well known in the semiconductor manufacturing process, and thus, detailed descriptions thereof will be omitted here.

A contact hole 102B for forming the plurality of metal pattern structures 210 (refer to FIG. 13) may be formed in the chamfer region CF by using a mask the same as a mask for forming a contact hole in the cell region. That is, the contact hole 102B for forming the plurality of metal pattern structures 210 may be formed by using a previous semiconductor manufacturing process without an additional process. In other words, the contact hole 102B may be formed concurrently with the contact hole in the cell region using the same process. Accordingly, forming the contact hole 102B may not require an additional process and may not increase a number of unit processes of forming the semiconductor device 100. Thus, the method of manufacturing the semiconductor device 100 according to the present inventive concepts may have high process efficiency.

The contact hole 102B on an upper surface of the gate structure GS and a contact hole 102C on an upper surface of the semiconductor substrate 10 may be formed by an anisotropic etching process by using the mask pattern M as an etch mask. The anisotropic etching process may be, for example, any one of physical etching, such as sputter etching, chemical etching, such as reactive radical etching, and physicochemical etching, such as reactive ion etching (RIE), magnetically enhanced RIE, transformer coupled plasma (TCP) etching, inductively coupled plasma (ICP) etching.

Via the etching process, the contact holes 102B and 102C having different heights may be formed. The contact holes 102B and 102C may be formed by adjusting an etch selectivity of a material included in the lower insulating layer forming layer 102 and a material included in the gate structure GS. The lower insulating layer 102A including the plurality of contact holes 102B and 102C may be formed via the etching process. The lower insulating layer 102A may refer to a first interlayer insulating layer.

Figure 11:
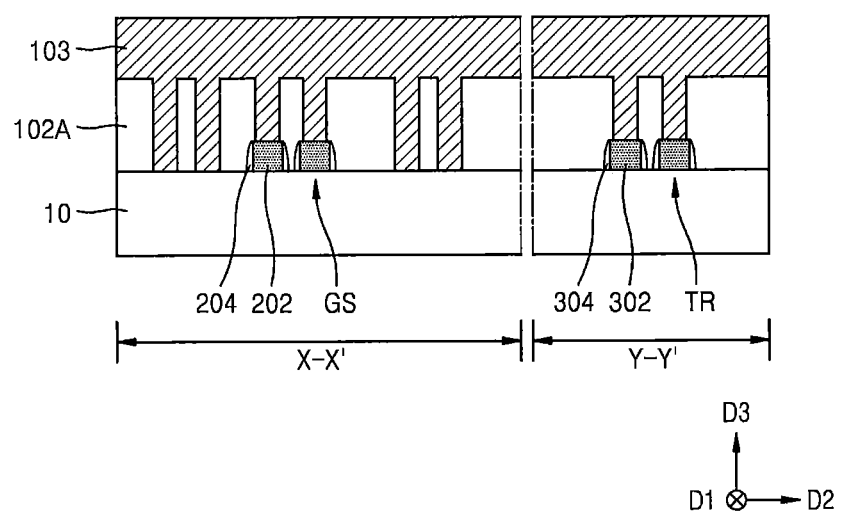

Referring to FIG. 11, the mask pattern M (refer to FIG. 10) on the lower insulating layer 102A may be removed via, for example, an ashing and a strip process, and a conductive layer 103 burying exposed surfaces of the semiconductor substrate 10, the gate structure GS, and the transistor TR, and an entire surface of the lower insulating layer 102A may be formed. The conductive layer 103 may be formed to have a sufficient thickness to bury the contact holes 102B and 102C included in the lower insulating layer 102A and cover the lower insulating layer 102A.

In some embodiments, the conductive layer 103 may include tungsten or a tungsten alloy. In some embodiments, a diffusion prevention layer (not shown) may be formed on exposed upper surfaces of the lower insulating layer 102A and the semiconductor substrate 10. The diffusion prevention layer may be formed by using Ti and TiN, to prevent diffusion of a material included in the conductive layer 103, for example, tungsten.

In some embodiments, a tungsten nucleation layer and a tungsten bulk layer may be formed on an upper surface of the diffusion prevention layer until the contact holes 102B and 102C are filled. The conductive layer 103 having a desired thickness may be formed via the process of forming the tungsten nucleation layer and the tungsten bulk layer. Here, the tungsten nucleation layer may have a higher reactivity than the tungsten bulk layer, and thus, the tungsten nucleation layer may easily form a tungsten thin film. However, the tungsten nucleation layer may have poor step coverage, and thus, a diameter of an upper portion of the contact holes 102B and 102C may be reduced. Thus, after the tungsten nucleation layer is formed thin, the tungsten bulk layer may be formed thick as through a subsequent process, in order to improve the step coverage.

In some embodiments, the conductive layer 103 may include copper or a copper alloy. After a copper seed layer (not shown) is formed on the exposed upper surfaces of the lower insulating layer 102A and the semiconductor substrate 10, electrical plating may be performed to form the conductive layer 103 on the copper seed layer by using copper.

In some embodiments, the conductive layer 103 may include Al, Rh, Os, Ti, Ta, Pd, Pt, Mo, metal silicide, or a combination thereof.

Figure 12:
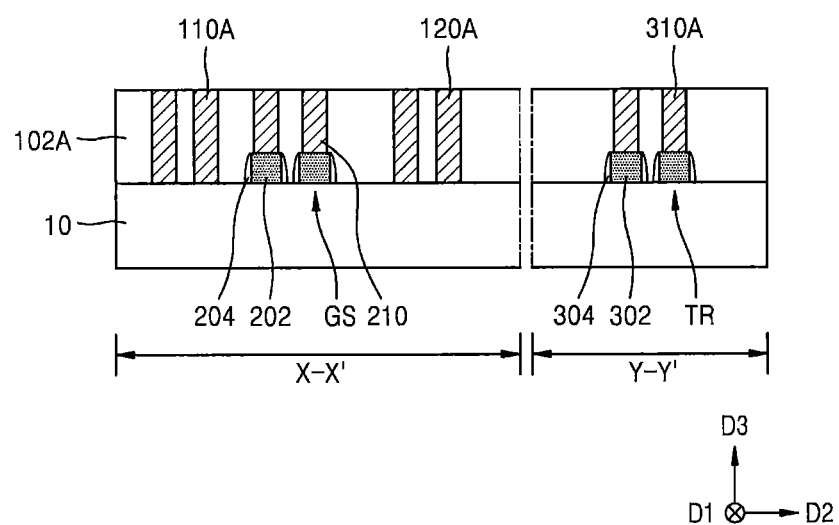

Referring to FIG. 12, the conductive layer 103 (refer to FIG. 11) formed on the entire surface of the lower insulating layer 102A may be removed (e.g., polished) to form a plurality of contacts 110A, 120A, 210, and 310A. The polishing process may be performed by using the lower insulating layer 102A as an etch stop layer. Thus, the conductive layer 103 may be planarized by using the polishing process to expose the upper surface of the lower insulating layer 102A. That is, upper surfaces of the plurality of contacts 110A, 120A, 210, and 310A may have the same height as the upper surface of the lower insulating layer 102A. The upper surfaces of the plurality of contacts 110A, 120A, 210, and 310A may be coplanar with the upper surface of the lower insulating layer 102A as illustrated in FIG. 12.

The polishing process may be performed via, for example, chemical mechanical polishing (CMP) or etch-back. The polishing of the conductive layer 103 may be performed under a condition in which etching of the lower insulating layer 102A is restrained to a maximum level. For example, when the polishing process is performed via the CMP, a slurry, a polishing pad, and a polishing condition, etc. may be adjusted to restrain the etching of the lower insulating layer 102A to a maximum level.

Figure 13:
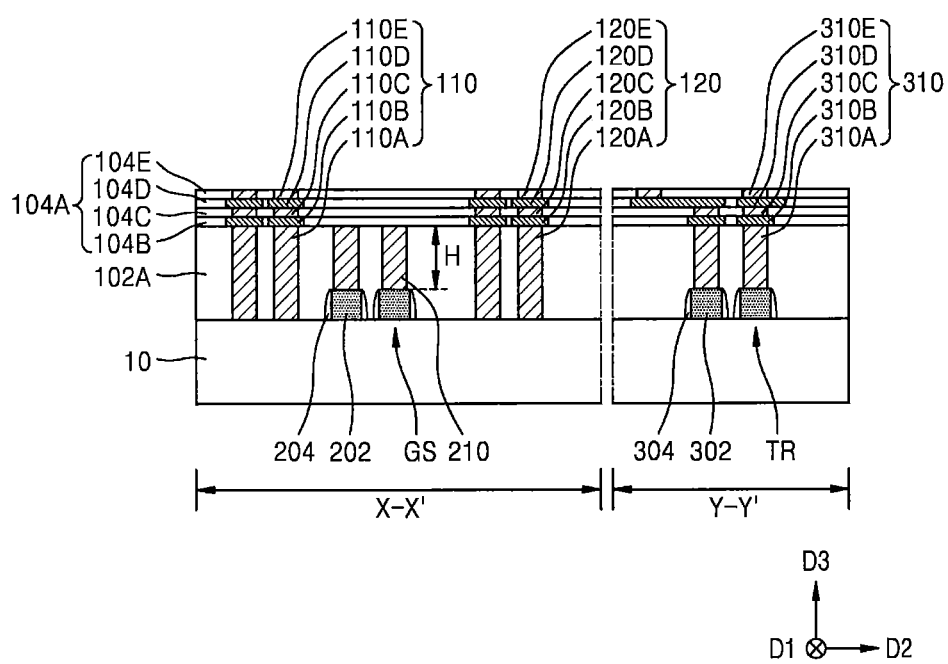

Referring to FIG. 13, the upper insulating layer 104A may be formed on the lower insulating layer 102A. The upper insulating layer 104A may be formed as a structure in which a third interlayer insulating layer 104C, a fourth interlayer insulating layer 104D, and a fifth interlayer insulating layer 104E are sequentially formed on a second interlayer insulating layer 104B. The number of interlayer insulating layers included in the upper insulating layer 104A is not limited thereto.

The second interlayer insulating layer 104B may include first dummy wiring layers 110B and 120B in the chamfer region CF, and a first wiring layer 310B in the cell region. The third interlayer insulating layer 104C may include first dummy vias 110C and 120C in the chamfer region CF, and a first via 310C in the cell region. The fourth interlayer insulating layer 104D may include second dummy wiring layers 110D and 120D in the chamfer region CF and a second wiring layer 310D in the cell region. The fifth interlayer insulating layer 104E may include second dummy vias 110E and 120E in the chamfer region CF and a second via 310E in the cell region.

In more detail, the second interlayer insulating layer 104B may be formed on the lower insulating layer 102A across the chamfer region CF and the cell region. The second interlayer insulating layer 104B may include openings exposing the plurality of contacts 110A, 120A, and 310A, and the first dummy wiring layers 110B and 120B and the first wiring layer 310B may be formed by filling the openings with a conductive material.

The third interlayer insulating layer 104C may be formed on the second interlayer insulating layer 104B. The third interlayer insulating layer 104C may include openings exposing the first dummy wiring layers 110B and 120B and the first wiring layer 310B, and the first dummy vias 110C and 120C and the first via 310C may be formed by filling the openings with a conductive material.

The fourth interlayer insulating layer 104D may be formed on the third interlayer insulating layer 104C. The fourth interlayer insulating layer 104D may include openings exposing the first dummy vias 110C and 120C and the first via 310C, and the second dummy wiring layers 110D and 120D and the second wiring layer 310D may be formed by filling the openings with a conductive material.

The fifth interlayer insulating layer 104E may be formed on the fourth interlayer insulating layer 104D. The fifth interlayer insulating layer 104E may include openings exposing the second dummy wiring layers 110D and 120D and the second wiring layer 310D, and the second dummy vias 110E and 120E and the second via 310E may be formed by filling the openings with a conductive material.

Although it is not illustrated, a passivation layer may be formed on the interlayer insulating layer 104A.

Via the processes described above, the guard ring 110, the crack sensing circuit 120, and the plurality of metal pattern structures 210 may be formed in the chamfer region CF and a conductive structure 310 including the contact 310A, the first wiring layer 310B, the first via 310C, the second wiring layer 310D, and the second via 310E may be formed in the cell region.

A height H of the plurality of metal pattern structures 210 may be less than a height of the guard ring 110 and the crack sensing circuit 120. It is illustrated in the drawings that the metal pattern structure included in the plurality of metal pattern structures 210 is formed on each of gate structures GS. However, it is not limited thereto.

In some embodiments, the plurality of metal pattern structures 210 may be formed by using a photolithography process and an etching process, after the upper insulating layer 104A is formed. That is, after the guard ring 110 and the crack sensing circuit 120 are formed, the plurality of metal pattern structures 210 may be formed.

According to the method of manufacturing the semiconductor device according to the present inventive concepts, the semiconductor device 100 including the plurality of metal pattern structures 210 for preventing crack dispersion which may occur in a die sawing process for cutting the semiconductor substrate 10 may be formed without an additional forming process.

Figure 14:
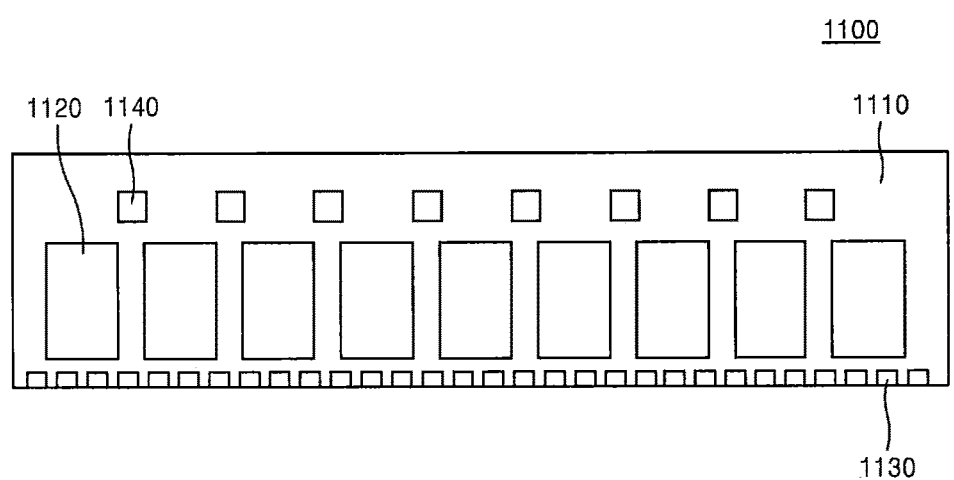
FIG. 14 is a plan view of a memory module including a semiconductor device according to some embodiments of the present inventive concepts.

FIG. 14 is a plan view of a memory module 1100 including a semiconductor device, according to some embodiments of the present inventive concepts.

Referring to FIG. 14, the memory module 1100 may include a module substrate 1110 and a plurality of semiconductor packages 1120 coupled to the module substrate 1110.

The plurality of semiconductor packages 1120 may include the semiconductor device 100 according to some embodiments. For example, the plurality of semiconductor packages 1120 may include the semiconductor device 100 illustrated in FIGS. 3, 4, and/or 5.

A contact unit 1130 which may be inserted into a socket of a main board may be arranged on a side of the module substrate 1110. A ceramic decoupling capacitor 1140 may be arranged on the module substrate 1110. The memory module 1100 according to the present inventive concepts is not limited to the structure illustrated in FIG. 14, and may be formed to have various shapes.

While the inventive concepts has been particularly shown and described with reference to example embodiments thereof, it will be understood that various changes in form and details may be made therein without departing from the spirit and scope of the following claims. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a semiconductor substrate comprising a square-shaped main chip region and a triangle-shaped chamfer region, wherein the square-shaped main chip region is defined by a first edge portion extending in a first direction and a second edge portion extending in a second direction that is perpendicular to the first direction, and the triangle-shaped chamfer region in a corner portion of the square-shaped main chip region; and
    a plurality of metal pattern structures on the semiconductor substrate in the triangle-shaped chamfer region, wherein each of the plurality of metal pattern structures has a continuous bar shape, each of the plurality of metal pattern structures extends in parallel to a hypotenuse of the triangle-shaped chamfer region, and each of the plurality of metal pattern structures extends from an upper surface of a respective gate structure in the triangle-shaped chamfer region.

2. The semiconductor device of claim 1, wherein a length of one of the plurality of metal pattern structures decreases as a distance between the one of the plurality of metal pattern structures and the hypotenuse of the triangle-shaped chamfer region increases.

3. The semiconductor device of claim 1, wherein the continuous bar shape of each of the plurality of metal pattern structures is linear.

4. The semiconductor device of claim 1, wherein the plurality of metal pattern structures have same width in a plan view.

5. The semiconductor device of claim 1, wherein the plurality of metal pattern structures are spaced apart from one another by same distance.

6. The semiconductor device of claim 1, wherein the plurality of metal pattern structures are spaced apart from the first edge portion and the second edge portion by same distance.

7. The semiconductor device of claim 1, wherein each of the plurality of metal pattern structures has a unitary structure.

8. The semiconductor device of claim 1, wherein each of the plurality of metal pattern structures comprises a single material.

9. The semiconductor device of claim 1, wherein each of the plurality of metal pattern structures has opposing flat sidewalls.

10. The semiconductor device of claim 1, wherein upper surfaces of the plurality of metal pattern structures are coplanar.

11. The semiconductor device of claim 1, wherein an upper surface of a guard ring and an upper surface of a crack sensing circuit of the semiconductor device are at a higher level than upper surfaces of the plurality of metal pattern structures with respect to the semiconductor substrate.

12. The semiconductor device of claim 1, further comprising an insulating layer on the plurality of metal pattern structures.

13. The semiconductor device of claim 12, wherein the insulating layer comprises:
   a lower insulating layer surrounding sidewalls of the plurality of metal pattern structures; and
   an upper insulating layer covering upper surfaces of the plurality of metal pattern structures.

14. The semiconductor device of claim 13, wherein a thickness of the lower insulating layer is greater than a thickness of the upper insulating layer.

15. The semiconductor device of claim 1, wherein the respective gate structure in the triangle-shaped chamfer region comprises a gate electrode and first and second spacers on respective side walls of the gate electrode.

* * * * *